United States Patent
Yim et al.

(10) Patent No.: US 9,911,878 B2
(45) Date of Patent: Mar. 6, 2018

(54) METAL-ASSISTED ETCH COMBINED WITH REGULARIZING ETCH

(71) Applicant: Advanced Silicon Group, Inc., Lincoln, MA (US)

(72) Inventors: Joanne Yim, San Francisco, CA (US);
Jeff Miller, Brookline, MA (US);
Michael Jura, Santa Monica, CA (US);
Marcie R. Black, Salem, NH (US);
Joanne Forziati, Everett, MA (US);
Brian Murphy, Revere, MA (US);
Lauren Magliozzi, Denver, CO (US)

(73) Assignee: Advanced Silicon Group, Inc., Lincoln, MA (US)

( * ) Notice: Subject to any disclaimer, the term of this patent is extended or adjusted under 35 U.S.C. 154(b) by 31 days.

(21) Appl. No.: 14/917,698

(22) PCT Filed: Aug. 27, 2014

(86) PCT No.: PCT/US2014/053000
§ 371 (c)(1),
(2) Date: Mar. 9, 2016

(87) PCT Pub. No.: WO2015/038340
PCT Pub. Date: Mar. 19, 2015

(65) Prior Publication Data
US 2016/0218229 A1     Jul. 28, 2016

Related U.S. Application Data

(60) Provisional application No. 61/876,133, filed on Sep. 10, 2013.

(51) Int. Cl.
*H01L 31/0236*     (2006.01)
*H01L 31/18*     (2006.01)
(Continued)

(52) U.S. Cl.
CPC .... *H01L 31/02366* (2013.01); *H01L 31/0236* (2013.01); *H01L 31/1804* (2013.01);
(Continued)

(58) Field of Classification Search
None
See application file for complete search history.

(56) References Cited

U.S. PATENT DOCUMENTS

| 2003/0134436 A1 | 7/2003 | Yates et al. |
| 2004/0262772 A1 | 12/2004 | Ramanathan et al. |

(Continued)

FOREIGN PATENT DOCUMENTS

| CN | 102703903 A | 10/2012 |
| CN | 102723401 A | 10/2012 |

(Continued)

OTHER PUBLICATIONS

Li Xiuling; "Metal assisted chemical etching for high aspect ratio nanostructures: A review of characteristics and applications in photovoltaics." Current Opinion in Solid State and Materials Science 16 (2012), pp. 71-81.*

(Continued)

*Primary Examiner* — David Sample
*Assistant Examiner* — Donald M Flores, Jr.
(74) *Attorney, Agent, or Firm* — Lando & Anastasi, LLP (57) ABSTRACT

In an aspect of the disclosure, a process for forming nanostructuring on a silicon-containing substrate is provided. The process comprises (a) performing metal-assisted chemical etching on the substrate, (b) performing a clean, including partial or total removal of the metal used to assist the chemical etch, and (c) performing an isotropic or substantially isotropic chemical etch subsequently to the metal-assisted chemical etch of step (a). In an alternative aspect of the disclosure, the process comprises (a) performing metal- (Continued)

assisted chemical etching on the substrate, (b) cleaning the substrate, including removal of some or all of the assisting metal, and (c) performing a chemical etch which results in regularized openings in the silicon substrate.

5 Claims, 8 Drawing Sheets

(51) Int. Cl.
  *B82Y 40/00* (2011.01)
  *H01L 21/306* (2006.01)
(52) U.S. Cl.
  CPC ......... *B82Y 40/00* (2013.01); *H01L 21/30604* (2013.01); *Y02E 10/50* (2013.01)

(56) References Cited

U.S. PATENT DOCUMENTS

| | | | |
|---|---|---|---|
| 2007/0062575 A1 | 3/2007 | Inomata | |
| 2009/0256134 A1 | 10/2009 | Buchine et al. | |
| 2011/0204489 A1* | 8/2011 | Lin | H01L 21/0337 257/629 |
| 2011/0215441 A1* | 9/2011 | Lin | H01L 21/306 257/618 |
| 2013/0099345 A1 | 4/2013 | Black et al. | |

FOREIGN PATENT DOCUMENTS

| | | |
|---|---|---|
| CN | 102751337 A | 10/2012 |
| TW | 201224122 A | 6/2012 |
| WO | 2012064373 A2 | 5/2012 |

OTHER PUBLICATIONS

Huang, Zhipeng; Geyer, Nadine; Werner, Peter; de Boor, Johannes; Gösele, Ulrich; "Metal-Assisted Chemical Etching of Silicon: A Review." Adv. Mater. 23 (2011), pp. 285-308.*

Chartier, C.; Bastide, S.; Levy-Clément, C.; "Metal-assisted chemical etching of silicon in HF-H2O2." Electrochimica Acta 53 (2008), pp. 5509-5516.*

International Search Report and Written Opinion from corresponding International Application No. PCT/US2014/053000 dated Dec. 4, 2014.

* cited by examiner

METAL-ASSISTED ETCH COMBINED WITH REGULARIZING ETCH

CROSS-REFERENCE TO RELATED APPLICATIONS

This application is a U.S. National Stage Application under 35 U.S.C. § 371 of International Application No. PCT/US2014/053000, filed Aug. 27, 2014, which claims priority to U.S. Provisional application Ser. No. 61/876,133, filed Sep. 10, 2013, each of which is incorporated herein by reference.

FEDRALLY SPONSORED RESEARCH

This invention was made with government support under Contract No. DE-EE0005323 (BA) awarded by the U.S. Department of Energy. The government has certain rights in the invention.

BACKGROUND OF THE INVENTION

For some years it has been believed that nanostructuring in lieu of or in addition to standard surface texturing is a road to more efficient but still cost-effective photovoltaic cells. One way in which nanostructuring can lead to more efficient photovoltaic cells is by reducing reflection of light out of the cell, producing what has often been referred to as "black silicon." Light that is reflected away from the sun-facing surface of the photovoltaic cell is lost in the sense that its energy cannot be converted to electricity by the photovoltaic cell.

A wide range of nanostructuring has been proposed. The present assignee has studied the formation of nanowires by etching as a road to nanostructuring, as discussed for example in U.S. Published Patent Application No. 2009/256134. Specifically, the use of metal-assisted etching of silicon has been widely regarded as promising.

The beneficial effects of nanostructuring are seen in the literature and in experience to be achievable with a wide range of specific shapes. A common denominator in some proposals is that the structures have geometric dimensions roughly of the order of the wavelength of the light which produces the electrical energy.

There is still a need for nanostructuring and cost-effective techniques to form it which lead to a net higher efficiency and other beneficial characteristics for photovoltaic cells.

SUMMARY OF THE INVENTION

In an aspect of the disclosure, a process for forming nanostructuring on a silicon-containing substrate is provided. The process comprises (a) performing metal-assisted chemical etching on the substrate, (b) performing a clean, including partial or total removal of the metal used to assist the chemical etch, and (c) performing an isotropic or substantially isotropic chemical etch subsequently to the metal-assisted chemical etch of step (a).

In accordance with another aspect, there is provided a silicon-containing substrate having a top surface which comprises nanostructuring which comprises substantially rounded depressions and which comprises residual metal deposits in at least some of the substantially rounded depressions. The residual metal deposits may comprise at least about $10^{10}$ atoms/cm$^2$, $10^{11}$ atoms/cm$^2$, or $10^{12}$ atoms/cm$^2$.

DETAILED DESCRIPTION OF THE INVENTION

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

Where a range of values is provided, it is intended that each intervening value between the upper and lower limit of that range and any other stated or intervening value in that stated range is encompassed within the disclosure. For example, if a range of 1 μm to 8 μm is stated, it is intended that 2 μm, 3 μm, 4 μm, 5 μm, 6 μm, and 7 μm are also disclosed, as well as the range of values greater than or equal to 1 μm and the range of values less than or equal to 8 μm.

In an aspect of the disclosure, a process for forming nanostructuring on a silicon-containing substrate is provided. The process comprises (a) performing metal-assisted chemical etching on the substrate, (b) performing a clean, including partial or total removal of the metal used to assist the chemical etch, and (c) performing an isotropic or substantially isotropic chemical etch subsequently to the metal-assisted chemical etch of step (a). In an alternative aspect of the disclosure, the process comprises (a) performing metal-assisted chemical etching on the substrate, (b) cleaning the substrate, including removal of some or all of the assisting metal, and (c) performing a chemical etch which results in regularized openings in the silicon substrate.

Step (a), the process of metal-assisted chemical etching, may be performed by a variety of steps which have been explored over the past decade, including by the present assignee. Step (b), the cleaning of the substrate, may take place by a variety of cleans widely accepted in industry, including cleans for removal of the metal used to assist the chemical etch. The regularizing chemical etch of step (c) may be one of a variety of chemical etches. Such chemical etches may be isotropic or approximately or substantially isotropic. As part of regularization, the roughly 90 degree angle edges often left by the metal-assisted chemical etching may become more rounded. It is also possible to produce some degree of regularization with an anisotropic etch, provided it is not too similar in effect to the metal-assisted chemical etch.

Figure 1:
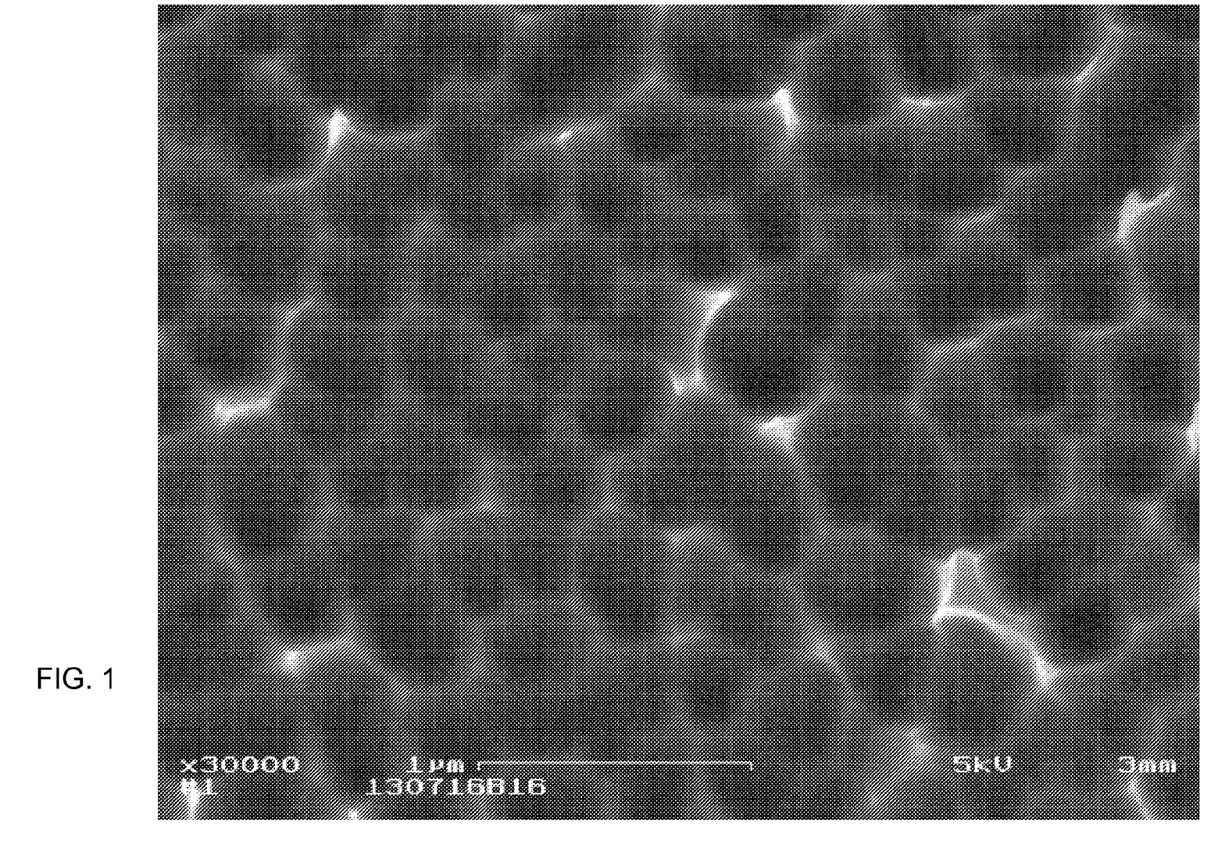
FIG. 1 depicts nanoparticles of silver on a substrate surface formed during a process similar to that of Exemplary Process 1.
Figure 2:
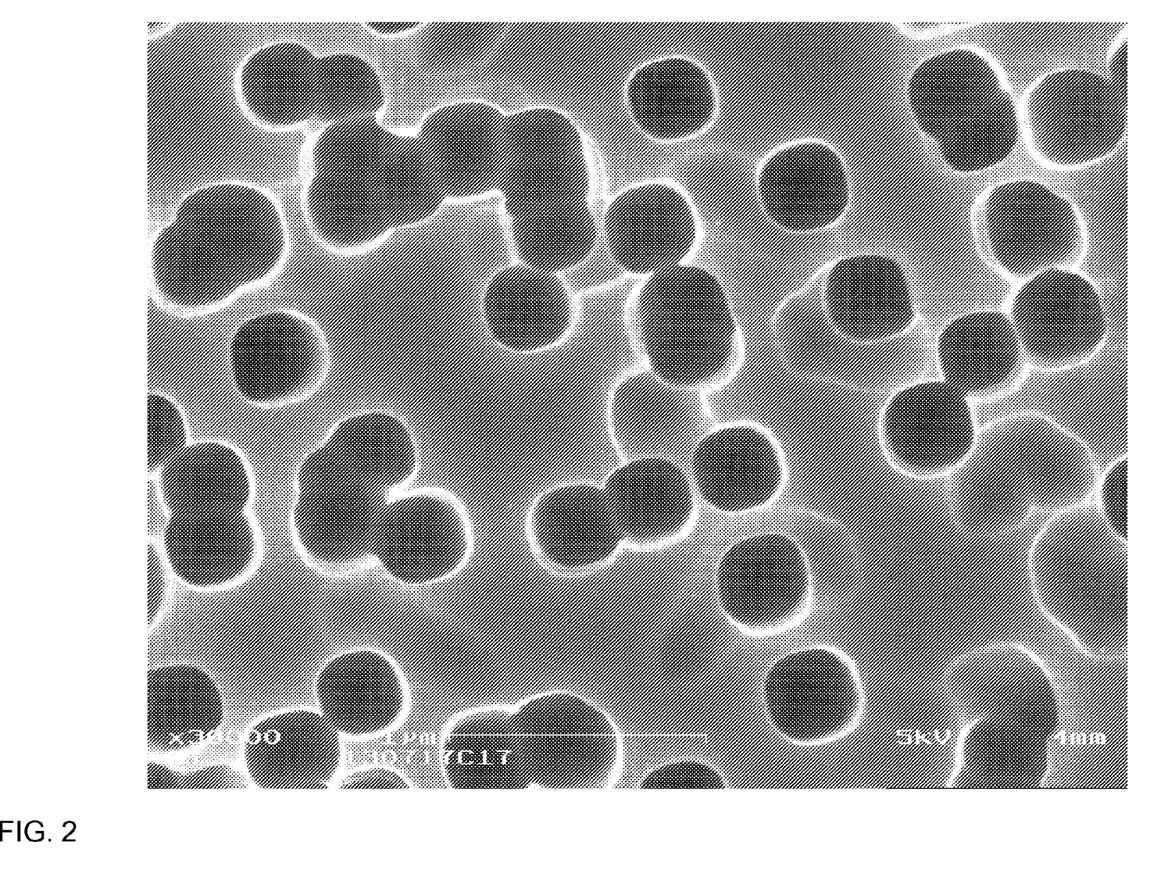
FIG. 2 depicts a top view of the nanostructuring formed as a result of Exemplary Process 1.

In an exemplary process for step (a), the assisting metal is laid in a pattern over the surface of a silicon or silicon-containing substrate. The assisting metal is preferably a noble metal, for example silver or gold. The pattern is preferably self-assembled rather than being generated from a mask or other similar template. A way to lay this pattern is to deposit a fairly thin layer, on the order of 8-20 nm, for example by sputtering, in such a way that the deposited layer of metal agglomerates as it is being deposited, forming islands, also more colloquially called blobs. Alternatively, deposition may be achieved, for example, from solution using, for example, $AgNO_3$ to deposit silver. The islands may then be subject to a process that further fosters agglomeration, for example an annealing process. The islands may also be etched in order to shrink them. The islands may be observed readily under SEM, as shown for example in FIG. 1. In other metal-assisted etching processes, it is possible to lay down more elaborate structures not necessarily consisting of islands. An example of such a structure is a set of islands plus a covering of deposited metal which occupies the majority of the area between the islands, wherein there are gaps between the blobs and the latter covering.

A variety of treatments may be employed for the step of agglomerating the deposited assisting metal. The agglomeration step may be carried out, for example, by heating the substrate with the initially deposited metal on it. The heating may take place in a chamber used for deposition, for example in the sputtering tool if the first metal deposition was through sputtering. The heating may alternatively take place in a separate chamber or oven. The heating or other agglomeration may take place in a liquid solution, for example water. The heating may be carried out, for example, at a temperature of at least about 150° C., at least about 200° C., at least about 250° C., at least about 300° C., at least about 350° C., or at least about 400° C. The heating may be carried out, for example, for a time on the order of minutes, for example between about 1 and 30 minutes, about 2 and 10 minutes, or about 3 and 7 minutes.

In the processes as described in this application, no use need be made of patterning by means of photolithography. While additional photolithographic steps are not excluded, it is believed that the process of agglomeration as described forms adequate nanosized patterns in many circumstances. The latter patterns are often suitable for metal-enhanced etching of useful nanostructures, providing adequate control for many applications without the need for the expense of photolithography.

Once the assisting metal has been deposited in a suitable pattern, it becomes possible to carry out the etch using a suitable etchant, for example HF with a suitable oxidizer, which may be for example HF with $H_2O_2$ or HF with oxygen bubbled through it. The metal assisted etch causes etching where the metal is present and results in an approximate drilling down into the silicon. It is therefore not isotropic but rather operates in a direction roughly normal to the surface. The direction tends to be closer to precisely normal where the surface being etched is of (100) crystalline orientation versus where it is of other crystalline orientations as is seen, for example, in multicrystalline silicon in which each grain may have its own orientation. The depth of the etch is in many conditions readily controllable. The aggressiveness of the etch may be varied, for example, by varying the strength of the oxidant. The duration of etching may be varied, for example, to vary the dimensions of the nanostructuring produced, and can vary for example between about 1 to about 15 minutes. Following the etching, one may in some cases dry the etched substrate, for example by drying the substrate in a spin rinse dryer after rinsing.

With metal-assisted etching as the nanostructure-producing etch, it has been possible to achieve a number of types of nanostructuring which make useful contributions to the efficiency and other desirable characteristics of photovoltaic cells. Because metal-assisting etch is not isotropic, for example, it can produce quite tall nanostructures.

However, it has surprisingly been discovered that a combination of metal-assisted etching with a subsequent regularizing etch, as in step (c) above, can be of value in achieving desirable values of the parameters pursued for photovoltaic applications, such as reflectance, quantum efficiency, and short circuit current. Specific recipes for the use of a regularizing etch in combination with a metal-assisted etch are given below.

It is possible to see the structure formed during the metal enhanced etch as being a template used to form the nanostructuring on the silicon surface using the regularizing etch.

Prior or subsequent to performing the regularizing etch, one may subject the substrate to a cleaning step. The cleaning step is preferably one which removes the etch-assisting metal in whole or in part. For example, a piranha clean may be used.

Nothing about the present disclosure requires that the etch of step (c) be precisely isotropic. It may also be approximately or substantially isotropic or, indeed, anisotropic if capable of having a desirable regularizing effect. Indeed, while the etch used in the examples below is generally regarded as isotropic, it may not be fully isotropic in the context of the nanostructures being etched. Furthermore, for a desirable rounded morphology and/or for the bottom line goals of reflectivity, quantum efficiency, etc., for photovoltaics or related goals for other devices, an anisotropic etch may be adequate if it is not as predominantly straight-down as a metal-assisted etch. Indeed, some metal may remain as residue despite the cleaning of the substrate. The residual metal may be observed, for example, via SEMs, or with inductively coupled plasma mass spectrometry (ICPMS), or with surface secondary ion mass spectroscopy (SIMS). In the event of some residue remaining or in the event the metal is cleaned only after the second etch, the second etch may involve a chemical-assisted component if a suitable etchant is used.

We do not wish to be bound by any particular theory of why further etches after metal-assisted etches can achieve desirable performance. However, we believe that the regularizing etch can remove surface defects while leaving a nanostructuring of desirable dimensions. For example, in certain experiments forming nanowires by metal-assisted chemical etching, porous silicon is observed on the tips of the nanowires, and it may be desired to remove it. The surface defects may also encompass, for example, recombination centers which would tend to reduce the performance of a photovoltaic cell by increasing the rate of electron-hole recombination.

Figure 3:
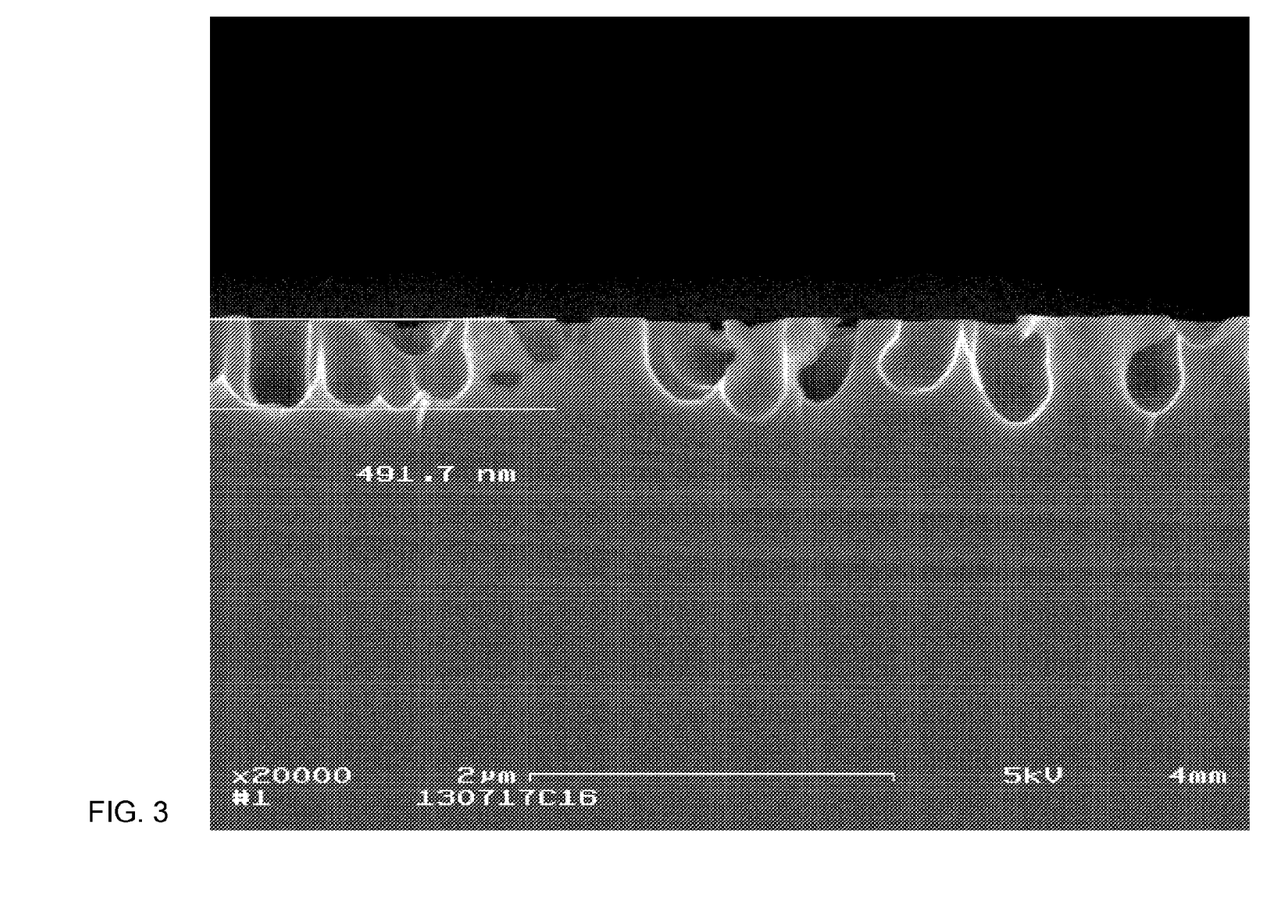
FIG. 3 depicts a side view of the nanostructuring formed as a result of Exemplary Process 1.

In addition to what is stated above, one seemingly desirable result of a regularizing etch is the roundedness of the etched-away volume specifically towards its bottom. This roundedness is seen, for example, in FIGS. 3, 5, and 7 of this application. Based on a crude "ray tracing" understanding of the light which impinges on a photovoltaic cell, it appears that light can in some circumstances be better captured and prevented from reflecting away from the cell by a rounded structure whose dimensions are of the approximate order of magnitude of the wavelength. One visualizes, for example, rays which would have hit a bottom with rounded edges close to vertically being reflected back up, whereas the same rays hitting a rounded bottom portion of a depression being reflected sideways and so impinging on the walls surrounding the depression and thus having a greater chance of ultimately being absorbed and being potentially available to generate electrical energy (or, in non-photovoltaic devices, for example, a detectable signal).

The second etch may have a further advantage in certain processes for manufacturing solar cells, in that it permits the step of saw damage removal to be eliminated or abbreviated. The overall processes of this disclosure with two etching steps may also produce results as effective or more effective than the reactive ion etches which have been proposed for solar cell manufacturing.

More generally, the type of process described in this disclosure may lead to solar cells with nanostructuring to which screen printed contacts are better (e.g., have lower contact resistance). Solar cells with such nanostructuring may, for example, have a better fill factor. In addition or alternatively, if better contacts are possible as a result of the nanostructuring, one may choose to decrease the surface doping concentration below that of standard processes. The lower the surface doping concentrations, the higher the contact resistance, but one may with such doping obtain better blue response and better passivation leading to better open-circuit voltages for the solar cells. The better contacts may also make it possible to employ doping processes which are less uniform across the wafer, such as doping with low $POCl_3$ rates.

In many cases, the two-step etch of the disclosure can be visualized roughly as first creating depressions in the silicon-containing substrate, which are then expanded outward by the regularizing etch. When the latter etch is isotropic or substantially isotropic, the depth of the depressions will persist initially during the latter etch because it etches away the top of the silicon-containing substrate as well as the bottoms of the depressions at roughly the same nm/s rate, but the depressions become wider and more rounded.

With the types of pattern formation described above for the assisting metal, the location of the islands or "blobs" will have a random component. This suggests that the depressions, as they are expanded by the regularizing etch, may come to overlap with each other. The overlap will vary considerably, for example, according to how much etch is employed and according to the average distance between depressions and the precise probability distribution of these distances. The overlap will leave nanostructuring of different appearances, which may for example comprise nanowires sticking up (see for example FIG. 5) or curved walls somewhat reminiscent of the curved walls found in certain gardens (see for example FIG. 7).

The rounded depressions of this disclosure may be formed at a variety of depths, for example depths in excess of about 1 μm, 500 nm, 100 nm, 50 nm, or 20 nm. They may also be formed at a variety of densities, for example at least about 10 depressions per $μm^2$, at least about 20 depressions per $μm^2$, at least about 30 depressions per $μm^2$, at least about 60 depressions per $μm^2$, or at least about 100 depressions per $μm^2$. They may have a variety of ranges of overlap, with the overlapping volume being at least about 5%, 10%, 20%, 40%, or 60% of the total volume of the depressions.

A reduction in reflectivity may result from the fact that as one approaches the substrate, the percentage of silicon versus other material (e.g., air, $SiN_x$) in a plane parallel to the substrate increases. For example, when one is above the nanostructuring, the percentage of silicon in such a plane parallel to the substrate is zero. The percentage then rises above zero as one reaches the top level of the nanostructuring. The percentage keeps increasing as one approaches the substrate. Then, when one reaches the bottommost of all the depressions, the percentage of silicon reaches its full bulk value (e.g., 100% for pure silicon). As a result of the increase of the percentage of silicon as one approaches the substrate in a direction perpendicular to the substrate, the effective index of refraction may also be expected to vary as one approaches the substrate in such a direction. The percentage of silicon averaged over the transition period is a measure of the density of the nanostructuring. It may be, for example, less than about 5%, less than about 10%, less than about 25%, or less than about 60%; it may be, for example, greater than about 5%, greater than about 10%, greater than about 25%, or greater than about 60%. The percentage of silicon at the average nanostructure height is an alternative measure of the nanowire density. It may be, for example, less than about 5%, less than about 10%, less than about 25%, or less than about 40%; it may be, for example, greater than about 5%, greater than about 10%, greater than about 25%, or greater than about 40%.

Figure 8:
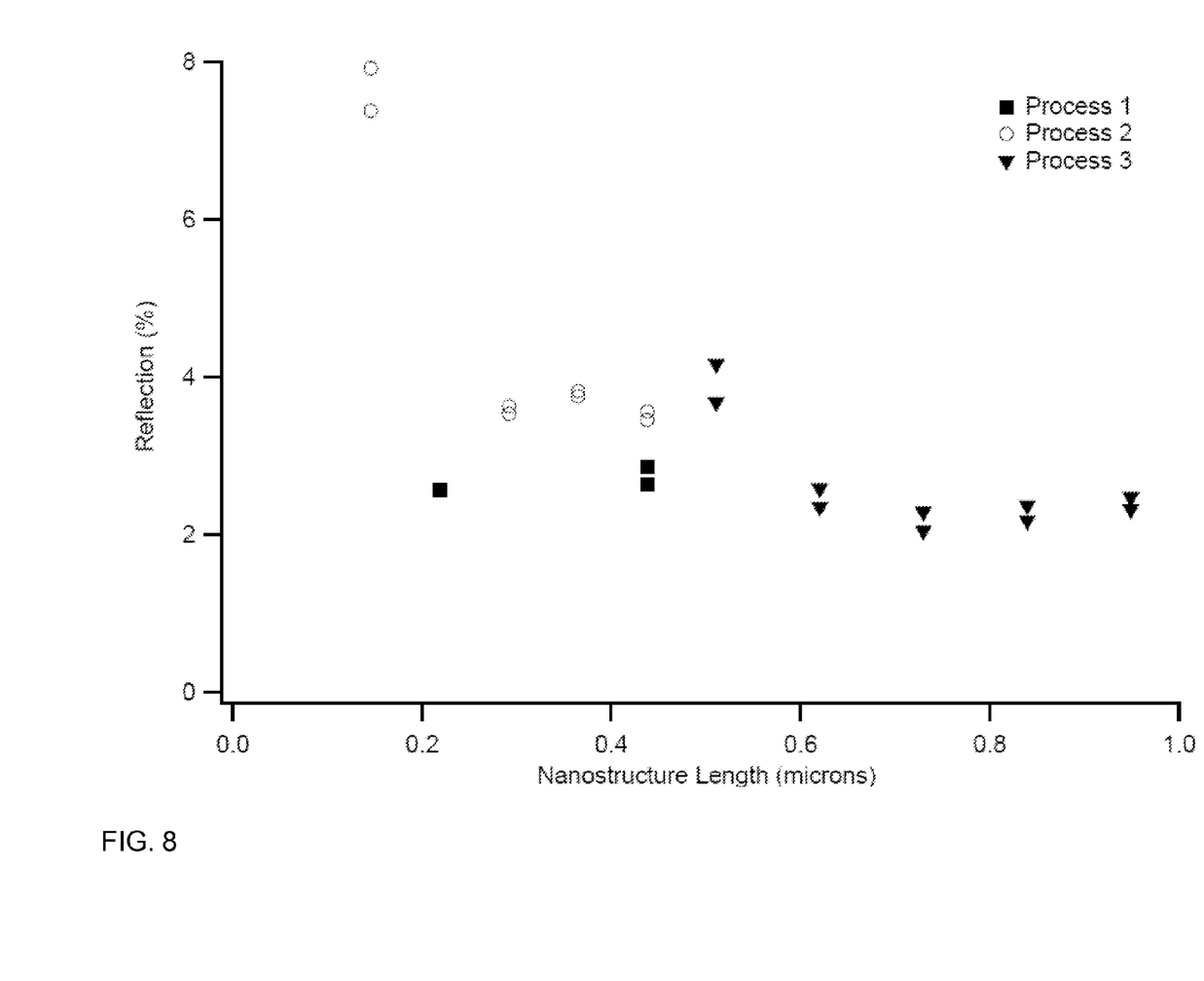
FIG. 8 depicts reflection as a function of nanostructure length in three manufacturing processes, where Process 1 is a process of the disclosure, whereas Processes 2 and 3 are processes of the kind disclosed in PCT/US14/13677, filed Jan. 29, 2014, assigned to the present assignee.

FIG. 8 depicts reflection as a function of nanostructure length in three manufacturing processes, where Process 1 is a process of the disclosure, whereas Processes 2 and 3 are processes of the kind disclosed in PCT/US14/13677, filed Jan. 29, 2014, assigned to the present assignee. The latter processes differ in that Process 2 has 80 nm of alumina, as does Process 1, whereas Process 3 has 25 nm alumina. As may be seen, for relatively short nanowires a lower reflection is achieved with Process 1. A solar cell made with processes of the disclosure may have a reflectance of no more than about 2%, 3%, or 4%, with nanowires which have a length of no more than about 0.4 nm, 0.5 nm, or 0.6 nm.

While the primary application which motivated the inventors in studying the etches of this disclosure was photovoltaic, there is no reason why the type of nanostructuring achieved in this disclosure would not be applicable in other types of devices which are created with nanostructuring. For example, the enhanced efficiency of capture of incoming light may be useful in a variety of detection scenarios. The structures might also be useful for LEDs, field emission devices, or substrates for Raman spectroscopy.

The silicon-containing substrate referred to in this disclosure may comprise monocrystalline, polycrystalline, or amorphous silicon. The entire substrate may consist of silicon (plus dopants, an inevitable small layer of "native" $SiO_2$ at the surfaces, and other impurities). The silicon may be alternatively layered (for example deposited) on a different material. Techniques like the present ones may also apply, for example, to substrates comprising Si/Ge materials.

Photovoltaic processing of the nanostructured silicon-containing substrates of the present disclosure involves a series of additional steps. These may include, for example, the formation of a p-n junction, edge isolation, passivation, screen printing of the front-side contacts, screen printing of the rear contacts, and firing of the contacts.

A particularly significant step in the formation of a photovoltaic cell is the formation of a p-n junction. Such a junction may be formed in the silicon nanostructuring or in the substrate below the silicon nanostructuring. The junction may be formed by a variety of doping technologies known to those of skill in the art, for example $POCl_3$ diffusion or ion implantation. In some cases a p-i-n junction may be employed.

The photovoltaic application may also require contacts to be made to the front and back sides of the silicon-containing substrate after formation of the p-n junction. A variety of approaches may be taken to those contacts, as described for example in U.S. Published Patent Application No. 2013/0099345 to the present assignee.

In what follows, exemplary processes of the disclosure are described. The following examples are put forth so as to provide those of ordinary skill in the art with a more complete disclosure and description of how to implement the invention, and are not intended to limit the scope of what the inventors regard as their invention. Efforts have been made to ensure accuracy with respect to numbers (e.g., amounts, temperature, etc.) but some errors and deviations should be accounted for.

Exemplary Process 1

Monocrystalline silicon material with a resistivity of 1-3 ohm-cm is selected having a surface with a (100) crystallographic orientation and p-type doping.

The first step is to do a saw damage removal process on the wafers. The saw damage removal comprises precleans and a KOH etch that removes the damage caused by forming the wafers. This is performed by first cleaning the wafers in a Piranha solution for 10 minutes. The Piranha step of this exemplary process employs 4 parts 96% sulfuric acid ($H_2SO_4$) and 1 part 30% hydrogen peroxide ($H_2O_2$) at elevated temperature. Prior to placing the wafer into the piranha solution, the latter is bubbled with $N_2$ for 2 minutes. The bubbling is then stopped and the wafer is submerged for 10 minutes. The solution is heated from the exothermic reaction. After the piranha etch, the wafer is cleaned 3 times with DI (deionized) water.

Next the wafers are dipped for 1 minute in a mix of 1 part 49% HF to 4 parts DI water to etch off the oxide formed during the Piranha clean. After the HF clean the wafers are removed and again rinsed three times and placed into a spin rinse dryer.

Next a polish etch is performed for 10 minutes in a solution of 1 part DI water, 1 part 45% potassium hydroxide (KOH) at about 70° C. The wafers are then rinsed three times in DI water. The wafers are then cleaned again with Piranha for 10 minutes and rinsed with water three times. The wafers are then cleaned in HF and again rinsed three times with water.

The sample is placed into a sputtering chamber for the deposition of the silver layer. The base pressure in the chamber is pumped down to $7.0 \times 10^{-7}$ Torr and then 14 nm of silver (Ag) is sputter deposited on the front of the wafer at a rate of about 7 Å/s at a pressure of 5 mTorr. The thickness of the silver is determined by a crystal monitor. The samples are then removed from the chamber.

The next step is to heat the layer of silver so that it coalesces and agglomerates on the surface forming into ball-like nanoparticle structures distributed more-or-less evenly on the surface of the wafer. The heating process can be done in situ in the sputtering tool or the sample can be removed from the sputtering tool and annealed in an oven or a furnace. In this example, the samples were removed from the sputtering tool and placed in a box furnace. The samples were then heated in a metal cassette at 300° C. for 5 minutes. The shape of the silver nanoparticles may be seen in FIG. 1, which is taken from a similar processing step in which about 18.5 nm of silver was deposited.

After forming nanoparticles of silver, they can then be shrunk to achieve a desired size. In the exemplary process, the nanoparticles are placed in an etch in 8000 mL nitric acid and 160 mL HF for 6 seconds.

The next step is an etch which uses the silver on the surface of the silicon to form a nanostructured silicon surface. The nanostructure formation occurs in an oxygen/HF bath. The wafer is placed in a dilute hydrofluoric acid (HF) bath. The bath contains 10 parts volume water to 1 part volume HF. The sample is etched in the HF bath for 6 minutes during which time oxygen is bubbled vigorously through the HF using a perforated Teflon tube (or alternatively a polypropylene tube). After that, the sample is rinsed three times in DI.

The silver is then removed and the sample is cleaned in a series of wet baths. The first bath is a piranha clean which consists of 4 ml of sulfuric acid ($H_2SO_4$) to 1 ml of 49 wt % hydrogen peroxide ($H_2O_2$) at an elevated temperature around 70° C. Prior to placing the wafer into the piranha, the bath is bubbled for 2 minutes. The wafer is submerged for 2 minutes. After the piranha etch, the wafer is cleaned 3 times with DI water.

The sample is then placed in dilute HF for 30 seconds. This HF solution has a volume ratio of 10:1 of water to 49% HF and is at room temperature. The wafer is then rinsed three times with DI water and dried in the spin rinse dryer.

The nanostructured wafer is then etched again using 8000 mL nitric acid plus 160 mL HF for 60 seconds. The wafer is then rinsed three times with DI water and dried in the spin rinse dryer.

Exemplary Process 2

Figure 4:
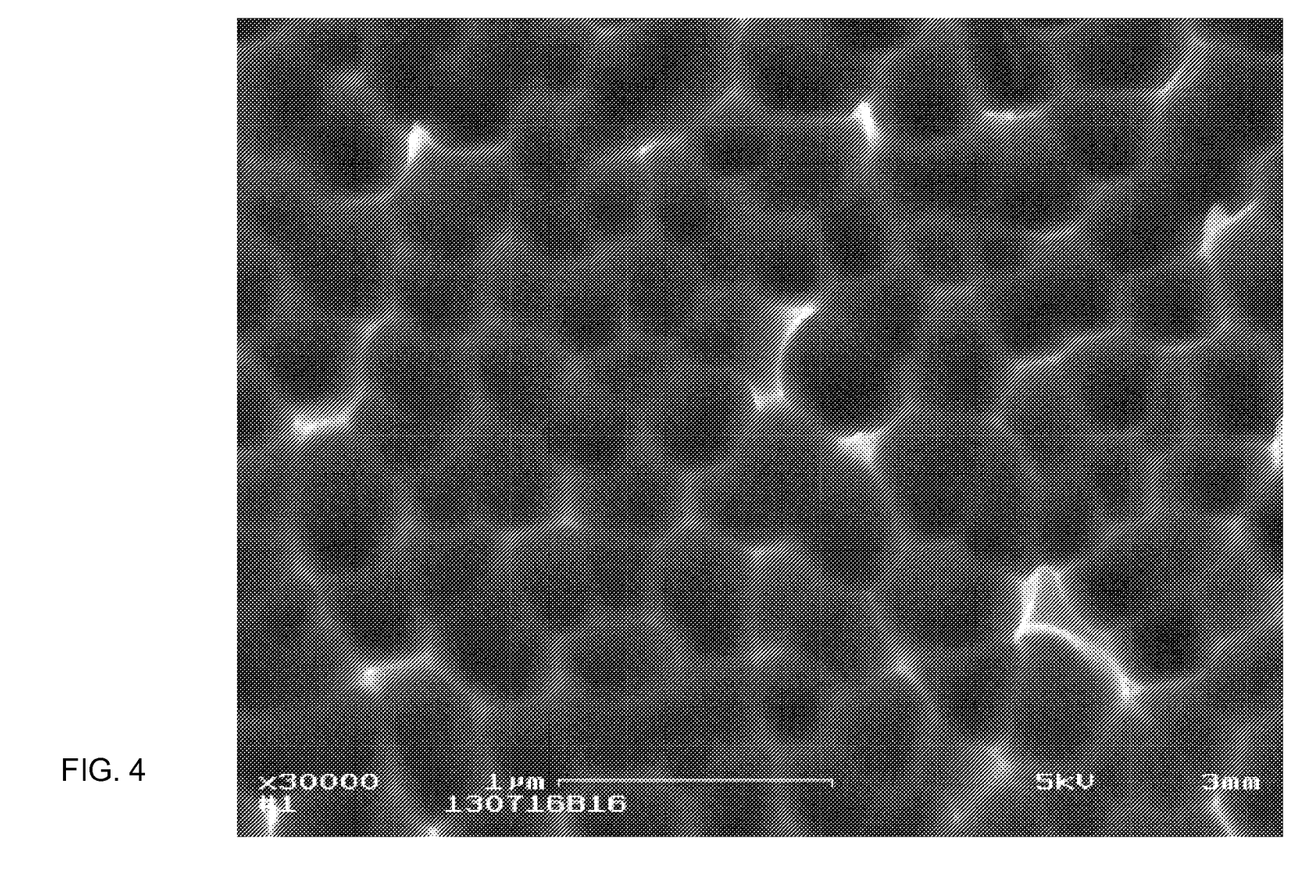
FIG. 4 depicts a top view of the nanostructuring formed as a result of Exemplary Process 2.
Figure 5:
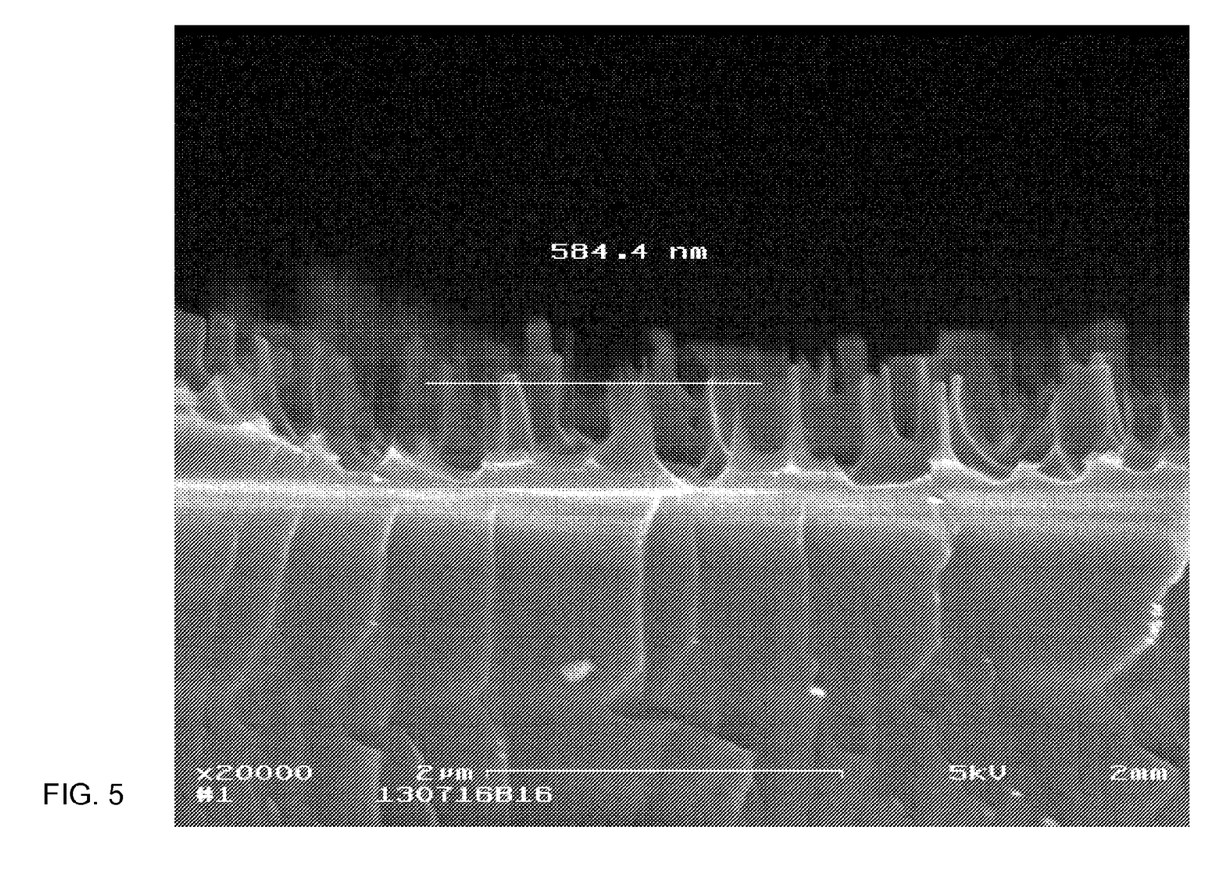
FIG. 5 depicts a side view of the nanostructuring formed as a result of Exemplary Process 2.

In a variation of the preceding process, the step of shrinking the silver nanoparticles is omitted, and the starting material is a multicrystalline wafer. The result may be seen in FIGS. 4 (top view) and 5 (side view).

Exemplary Process 3

Figure 6:
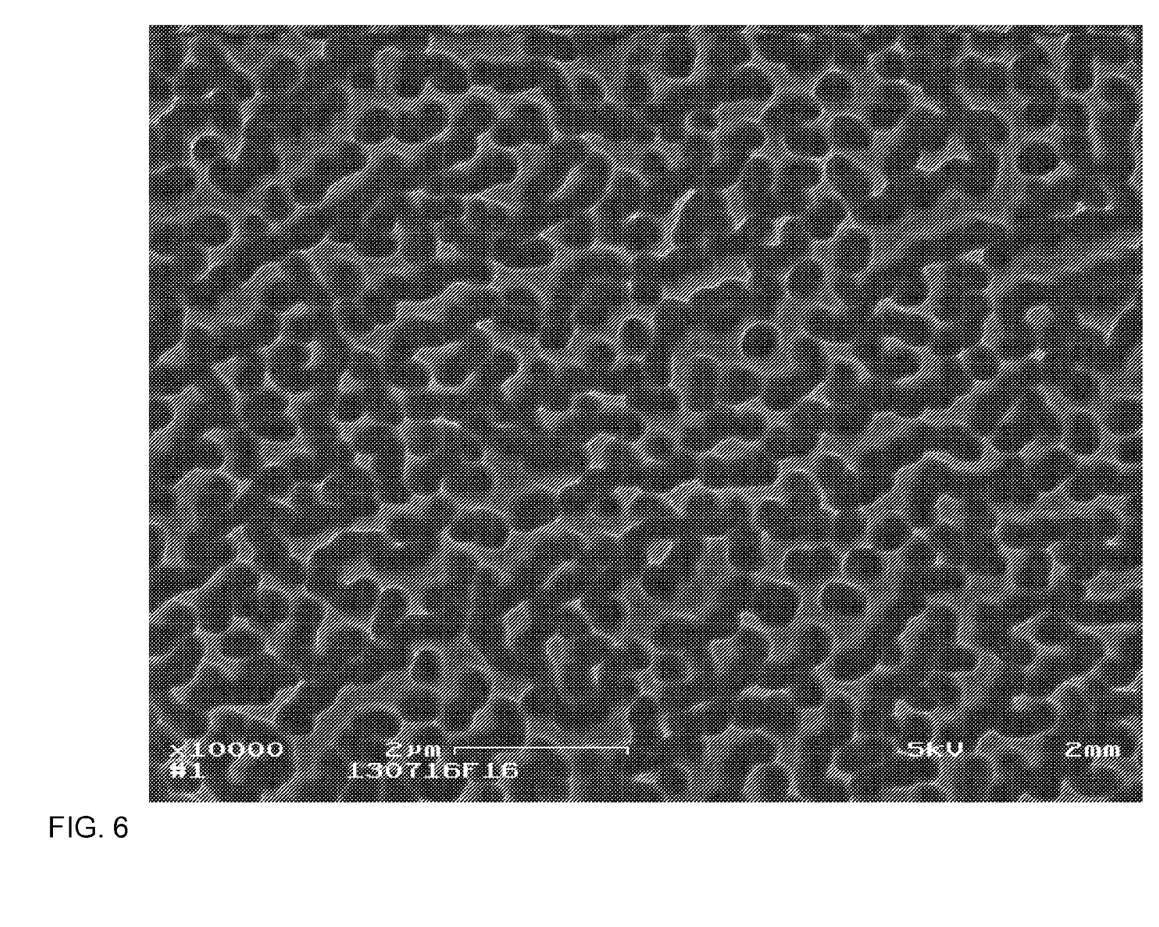
FIG. 6 depicts a top view of the nanostructuring formed as a result of Exemplary Process 3.
Figure 7:
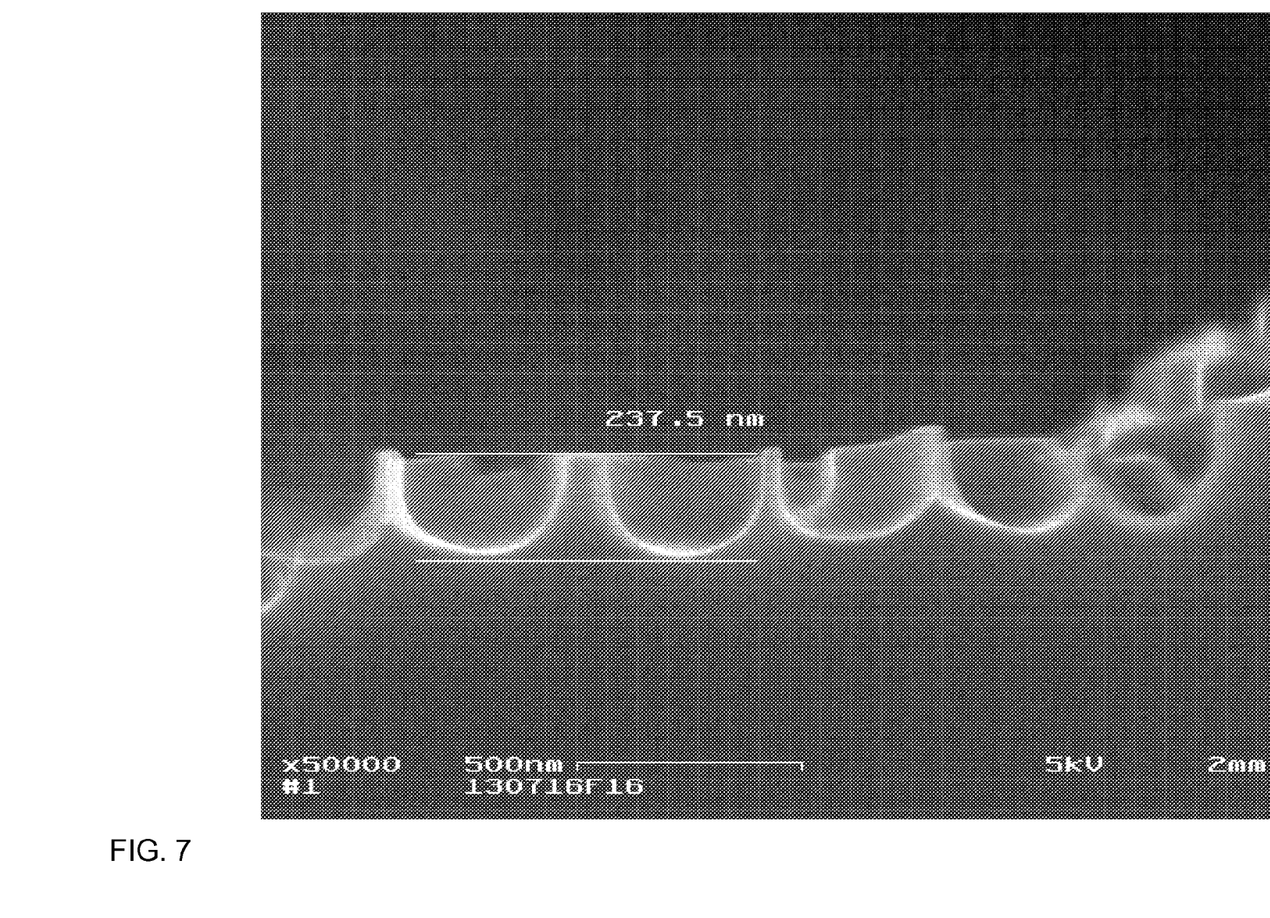
FIG. 7 depicts a side view of the nanostructuring formed as a result of Exemplary Process 3.

This exemplary process is the similar to exemplary process 2, except for two changes. The first is that instead of a 6 minute etch in HF bubbled with oxygen, only a 3 minute etch was carried out. The second difference is instead of a 60 second etch in 8000 mL nitric acid plus 160 mL HF, the etch was carried out for 15 seconds. The result may be seen in FIGS. 6 (top view) and 7 (side view).

The following references may be relevant to this application: (1) Sami Franssila, *Introduction to Microfabrication* (2d ed. John Wiley & Sons 2010). (2) U.S. Published Patent Application No. 2009/256134 to the present assignee. (3) X. Li and P. Bohn, Appl. Phys. Letters, vol. 77, pp. 2572-2574 (2000). (4) Hidetaka Asoh et al., Electrochem. Comm. vol. 9, pp. 535-539 (2007). (5) Jianwei Shi et al., Solid State Electronics, vol. 85, pp. 23-27 (2013). (6) Dirk-Holger Neuhaus and Adolf Münzer, Advances in OptoElectronics, Volume 2007, Article ID 24521. (7) Alex Stavrides et al., "Plasma Texturing for Efficiency Improvement in c-Si Solar Cells," 6th SNEC PV Power Expo, 6-8 May 2012, Shanghai. (8) Jianhua Zhao et al., "A 19.8% Efficient Honeycomb Multicrystalline Silicon Solar Cell with Improved Light Trapping," IEEE Transactions on Electron Devices, Vol. 46, pp. 1978-83 (1999). (9) U.S. Published Patent Application No. 2007/62575 to Kyocera.

All patents, patent applications, and publications mentioned in this application are hereby incorporated by reference in their entireties. However, where a patent, patent application, or publication containing express definitions (including definitions via disclaimer) is incorporated by reference, those express definitions should be understood to apply to the incorporated patent, patent application, or publication in which they are found, and not to the remainder of the text of this application, in particular the claims of this application.

The invention claimed is:

1. A silicon-containing substrate having a top surface which comprises nanostructuring which comprises rounded depressions and which comprises residual metal deposits in at least some of the substantially rounded depressions, terminal end portions of the rounded depressions being substantially rounded and smooth on the nanoscale.

2. The substrate of claim 1, wherein the residual metal deposits comprise at least about $10^{10}$ atoms/cm$^2$, $10^{11}$ atoms/cm$^2$, or $10^{12}$ atoms/cm$^2$.

3. The substrate of claim 1, wherein the residual metal comprises silver.

4. The substrate of claim 1, wherein the substrate forms part of a solar cell.

5. The substrate of claim 1, wherein the density of depressions is at least about 100 depression per µm$^2$.

* * * * *